United States Patent [19]

Takeyama et al.

[11] Patent Number: 5,088,008
[45] Date of Patent: Feb. 11, 1992

[54] CIRCUIT BOARD FOR MOUNTING ELECTRONIC COMPONENTS

[75] Inventors: Takeshi Takeyama; Mitsuhiro Kondo, both of Oogaki, Japan

[73] Assignee: Ibiden Co., Ltd., Japan

[21] Appl. No.: 589,522

[22] Filed: Sep. 28, 1990

Related U.S. Application Data

[63] Continuation of Ser. No. 460,004, Jan. 12, 1990, Pat. No. 5,022,960.

[30] Foreign Application Priority Data

May 1, 1989 [JP] Japan .................. 1-113425

[51] Int. Cl.$^5$ .................. H05K 7/10; H05K 5/02; H01L 23/48; B44C 1/22
[52] U.S. Cl. .................. 361/403; 29/827; 156/643; 156/656; 156/659.1; 156/668; 357/70; 361/421; 219/121.69; 428/137; 428/209
[58] Field of Search ........... 156/643, 656, 634, 659.1, 156/661.1, 664, 665, 666, 668, 901, 902; 29/827, 846, 852; 357/69, 70; 174/68.5; 428/596, 601, 137, 209, 901; 361/397, 400, 401, 403, 406, 414, 421; 437/209, 220; 219/121.68, 121.69, 121.85

[56] References Cited

U.S. PATENT DOCUMENTS

| 3,711,625 | 1/1973 | Dupuis ............... 156/261 X |
| 4,480,288 | 10/1984 | Gazdik et al. ......... 361/398 |
| 4,642,160 | 2/1987 | Burgess ............... 156/630 |
| 4,786,358 | 11/1988 | Yamazaki et al. ........ 156/643 |
| 4,949,225 | 8/1990 | Sagisaka et al. ........ 361/414 |

FOREIGN PATENT DOCUMENTS

| 2828146 | 1/1979 | Fed. Rep. of Germany. |
| 3119884 | 11/1982 | Fed. Rep. of Germany. |
| 3140061 | 2/1983 | Fed. Rep. of Germany. |
| 52-48972 | 4/1977 | Japan. |
| 60-41249 | 3/1985 | Japan. |
| 60-194553 | 10/1985 | Japan. |
| 61-95792 | 5/1986 | Japan. |
| 63-114150 | 5/1988 | Japan. |
| 64-76747 | 3/1989 | Japan. |
| 2189084 | 10/1987 | United Kingdom. |

*Primary Examiner*—William A. Powell
*Attorney, Agent, or Firm*—Leydig, Voit & Mayer

[57] ABSTRACT

According to the present invention, a circuit board for mounting electronic components wherein a metal layer united with a substrate layer has a predetermined portion exposed is manufactured by:

(1) arranging a mask between the substrate layer and a part of the metal layer to become the exposed part, and thereafter unitizing the substrate layer with the metal layer;

(2) projecting a laser beam onto that part of the substrate layer on the metal layer which surrounds the mask, in a direction from a side of the substrate layer to a side of the metal layer, thereby to cut away the part of the substrate layer surrounding the mask; and (3) stripping off that part of the substrate layer which remains on the mask, together with the mask.

4 Claims, 8 Drawing Sheets

FIG. I
(PRIOR ART)
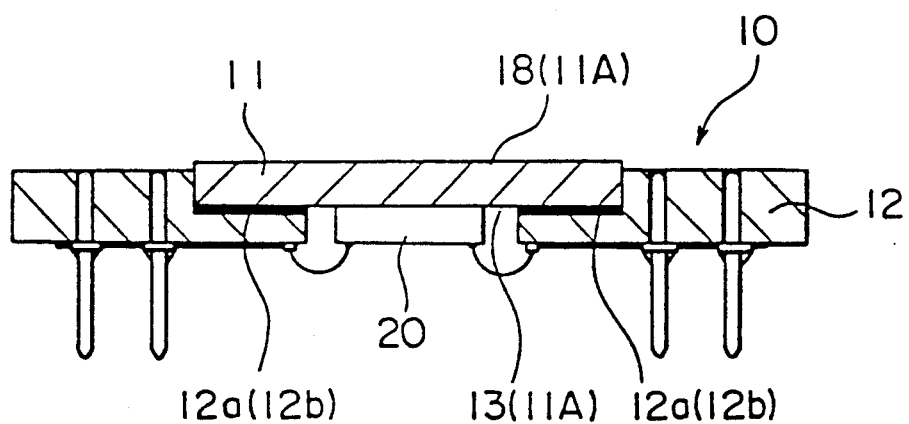

CIRCUIT BOARD FOR MOUNTING ELECTRONIC COMPONENTS

This application is a continuation of application Ser. No. 460,004, filed Jan. 12, 1990, now U.S. Pat. No. 5,022,960.

The present invention relates to a circuit board for mounting electronic components constructed by integrating a substrate layer with a metal layer. More particularly, it relates to a a circuit board for mounting electronic components in which a predetermined part of the metal layer is exposed from the substrate layer by utilizing laser machining.

In the accompanying drawings:

FIG. 1 is a sectional view of a circuit board for mounting electronic components formed by a manufacturing method in the prior art;

FIGS. 2(a) thru 2(d) are partially-enlarged sectional views each showing an intermediate process in the prior-art manufacture of the circuit board for mounting electronic components depicted in FIG. 1;

FIGS. 3(a) and 3(b) are partially-enlarged sectional views each showing an intermediate process in the manufacture of a circuit board for mounting electronic components formed by another manufacturing method in the prior art;

FIGS. 4(a) thru 4(c) are partially-enlarged sectional views each showing an intermediate process in the manufacture of a circuit board for mounting electronic components formed by a manufacturing method according to the present invention;

Figure 5:
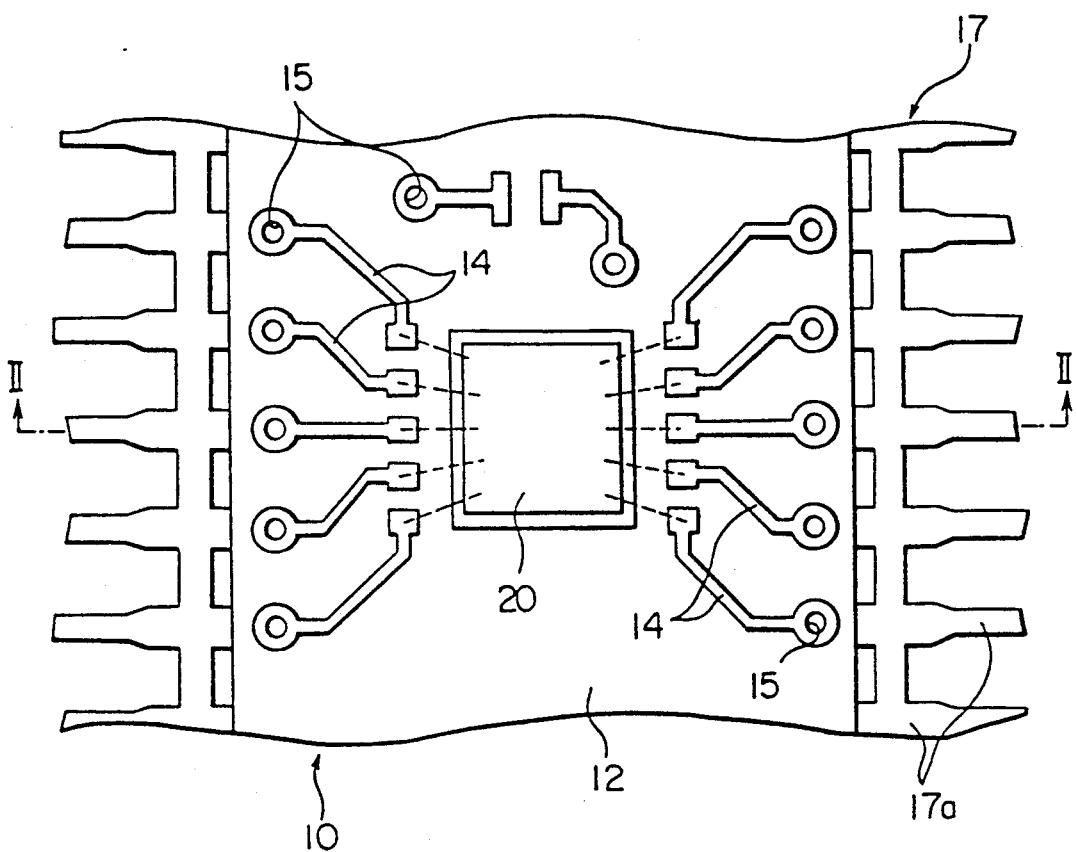
FIG. 5 is a partially-enlarged plan view showing an example of the circuit board for mounting electronic components formed by the manufacturing method according to the present invention.
Figure 6:
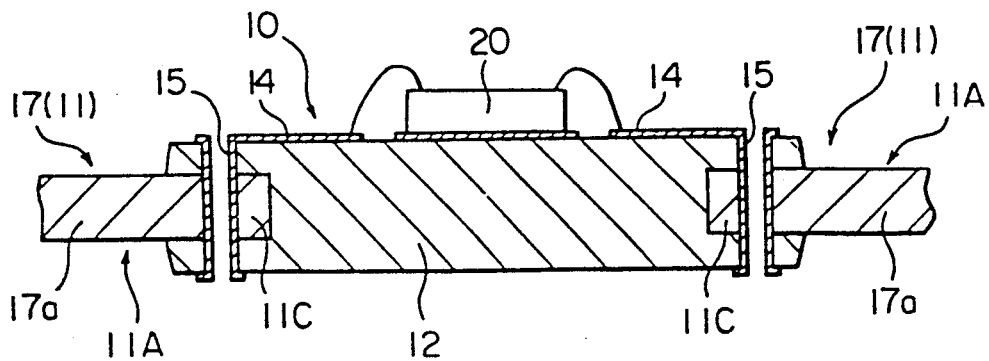
FIG. 6 is a sectional view taken along line II—II in FIG. 5.
Figure 7A:
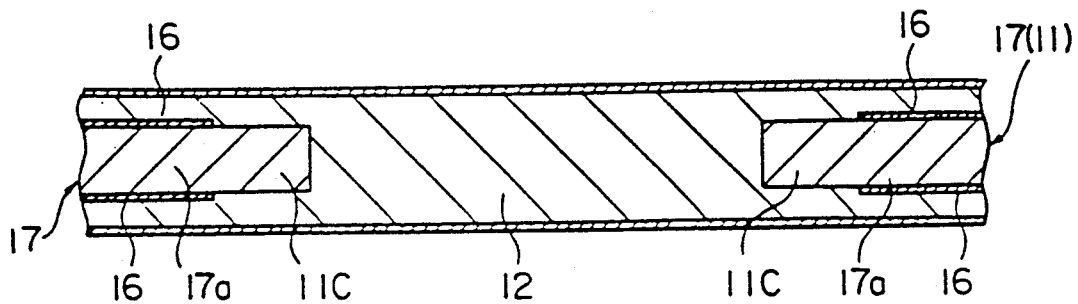
Figure 7B:
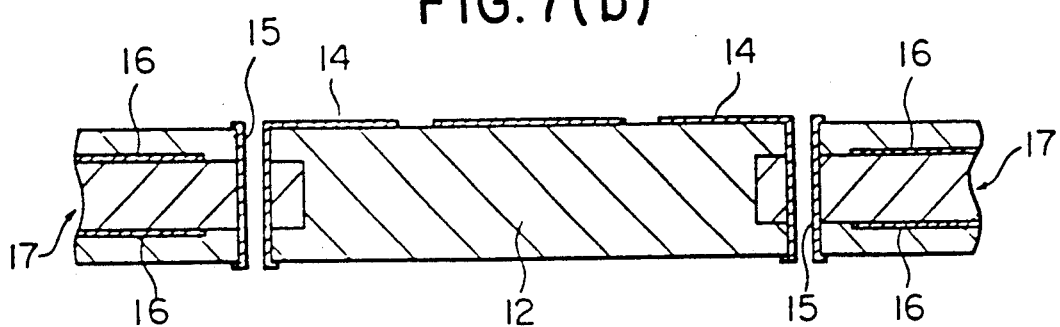
Figure 7C:
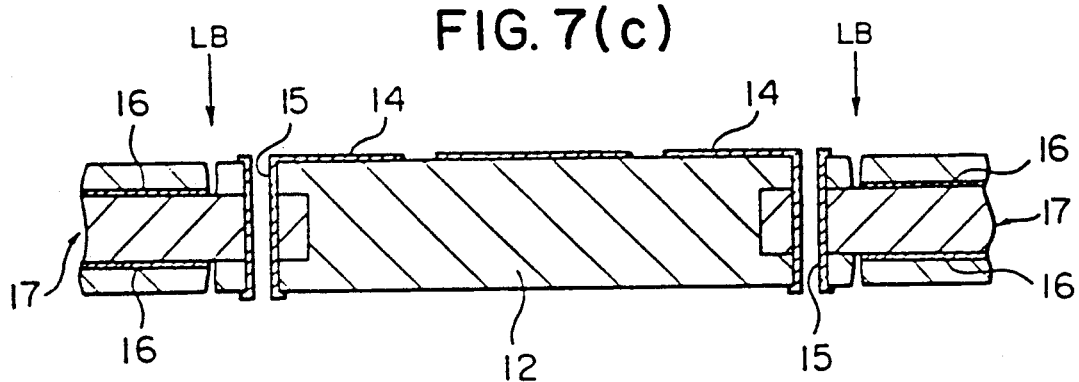
Figure 8:
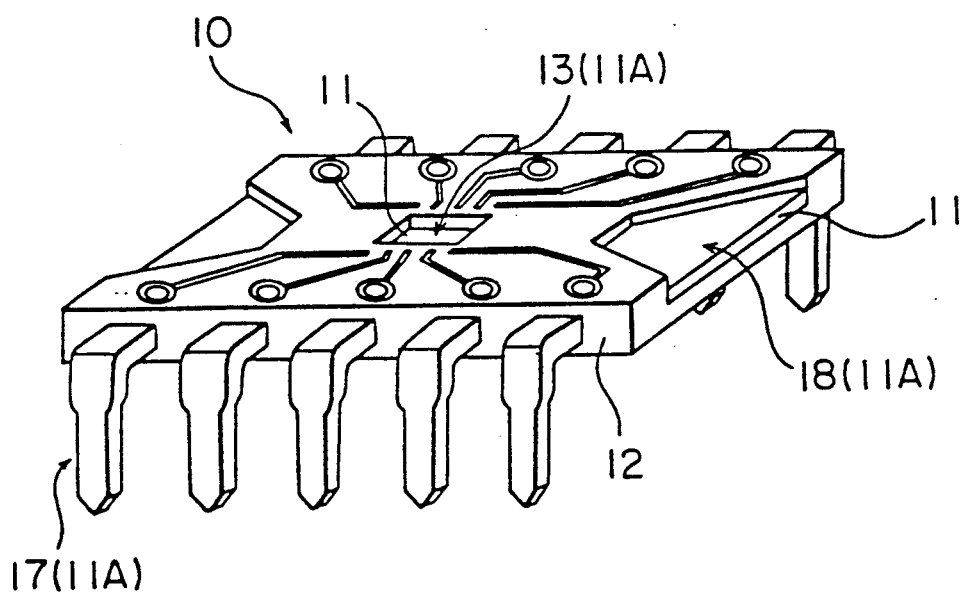
Figure 9A:
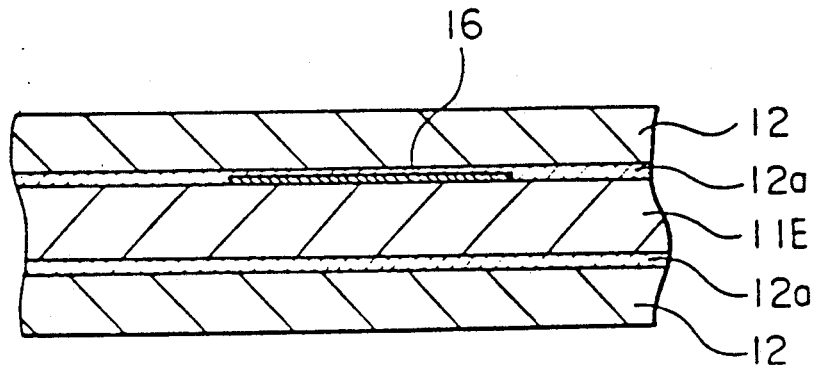
Figure 9B:
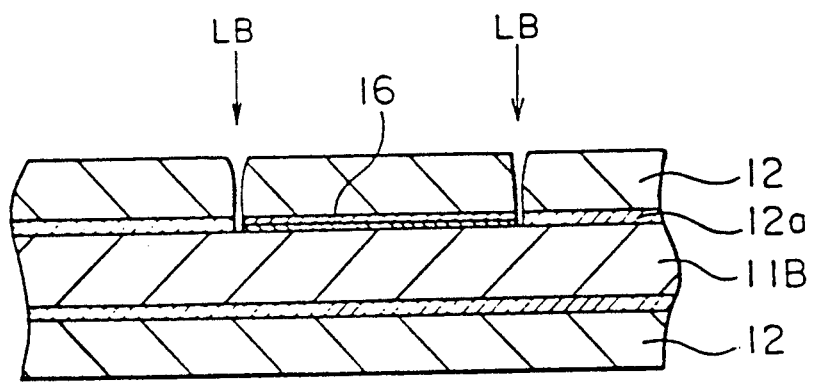
Figure 9C:
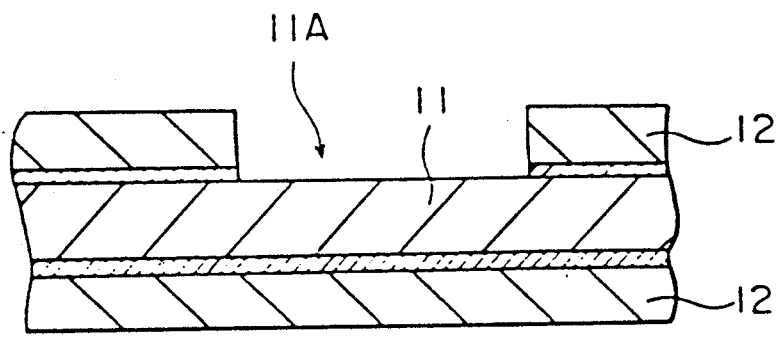

FIGS. 7(a) thru 7(c) are partially-enlarged sectional views each showing an intermediate process in the manufacture of the circuit board for mounting electronic components depicted in FIGS. 5 and 6.;

FIG. 8 is a perspective view showing another example of the circuit board for mounting electronic components formed by the manufacturing method according to the present invention; and FIGS. 9(a) thru 9(c) are partially-enlarged sectional views each showing an intermediate process in the manufacture of the circuit board for mounting electronic components depicted in FIG. 8.

As highly integrated electronic components of recent years cannot be used as they are to constitute various electronic equipment they must be used after being mounted on a circuit boards. To this end, circuit boards for mounting electronic components of various types have heretofore been developed and proposed.

A circuit board for mounting electronic components of the type wherein an electronic component is connected with terminals, such as leads, for externally connecting the component, is constructed as a circuit board for mounting electronic components, in such a way that a substrate layer formed of a resin or the like and exhibiting excellent insulating properties is united to a metal layer which serves as a conductor layer, lead, heat transmission layer or the like, and that conductor circuit pieces or the like are formed on the front surface or interior of the substrate layer.

Regarding such a circuit board for mounting electronic components, it is common practice, as shown in FIG. 1, to expose a metal layer 11 from a substrate layer 12 in order to form, e.g., a recess 13 for mounting an electronic component 20 thereon and a heat radiating portion 18 for dissipating heat produced from the electronic component 20.

The reason for forming the electronic component-mounting recess 13 and the heat radiating portion 18 with the metal layer 11 exposed from the substrate layer 12 as mentioned above is so that the heat produced when energizing the electronic component 20 can be transferred directly to the metal layer 11 of high thermal conductivity and further dissipated from the heat radiating portion 18 into the atmosphere, thereby enhancing the heat dissipation of the electronic component 20, or so that the circuit board for mounting electronic components with the metal layer exposed from the substrate layer 12 with the electronic component 20 mounted thereon can be thinned down as a whole.

A prior-art method of forming the exposed metal part 11A of the circuit board for mounting electronic components as stated above has been usually performed as follows: As illustrated in FIGS. 2(a)–2(d) by way of example, an adhesive sheet 12a is bonded by thermocompression (tentatively bonded) to one surface of the substrate layer 12 by means of a press or the like, the adhesive sheet being formed in such a way that a thermosetting resin composite which contains an epoxy resin, an unsaturated polyester resin, a polyimide resin or the like as its principal component is molded into the shape of a sheet or a film and that the sheet or film is brought into a semi-hardened state by heating it at a proper temperature for a proper period of time. Thereafter, those parts of the substrate layer 12 and the adhesive sheet 12a which correspond to the exposed metal part 11A are cut away using a drill 30. The cutting is effected by a router or the like, and is performed by hollowing out the substrate layer 12. The metal layer 11 is stuck to the substrate layer 12 thus machined and is bonded by thermocompression (finally bonded) thereto by means of a press or the like again, whereby the circuit board for mounting electronic components as needed is formed.

In order to employ the adhesive sheet 12a as stated above for the bonding between the substrate layer 12 and the metal layer 11, a low flowability is required of the resin of this adhesive sheet during the heating and compression thereof. This is to prevent the resin of the adhesive sheet 12a from flowing out and covering the part of the surface of the metal layer 11 to become the exposed part 11A when the substrate layer 12 and the metal layer 11 are bonded by thermocompression (finally bonded) by means of a press or the like An adhesive sheet 12a having such low flowability is ordinary endowed with flexibility by adding a rubber-like component into the thermosetting resin composite, providing a adhesiveness as well as low flowability. As a result of the addition of the rubber-like component, however, this type of adhesive sheet has such disadvantages as degrated heat resistance, resistance to moisture, resistance to chemicals, etc.

Accordingly, the circuit board for mounting electronic components 10, which is formed with the exposed metal part 11A by bonding the substrate layer 12 and the metal layer 11 with the adhesive sheet 12a of low flowability as stated above, cannot attain satisfactory reliability in heat resistance, resistance to moisture, resistance to chemicals, etc.

Figure 2A:
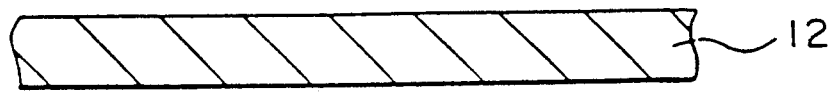
Figure 2B:
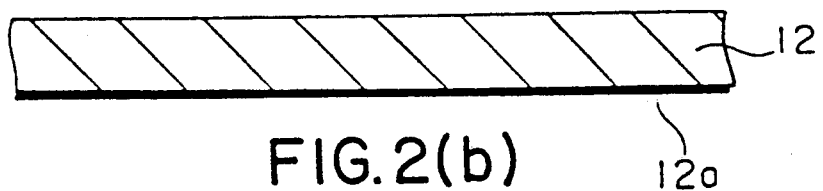
Figure 2C:
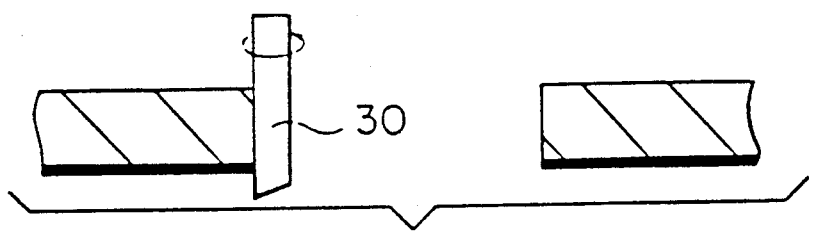
Figure 2D:
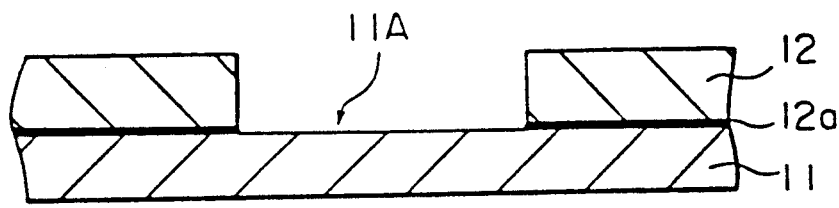
Figure 3A:
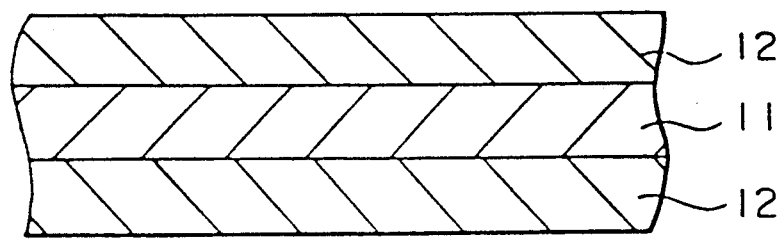
Figure 3B:
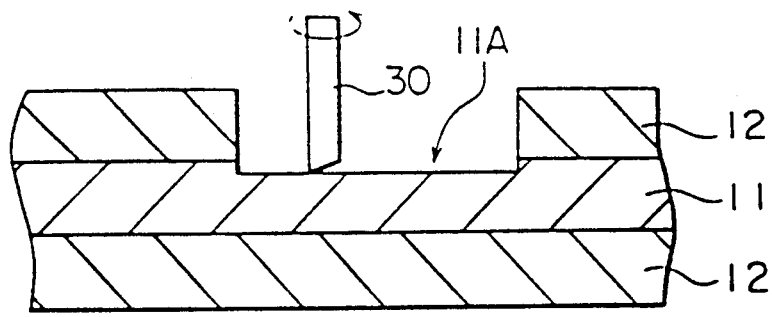

Another prior-art method has been as follows: As illustrated in FIGS. 3(a)-3(b) by way of example, layers of so-called "prepreg" 12b are stacked on the metal layer 11, the prepreg being prepared in such a way that glass cloth or the like is impregnated with a thermosetting resin and that the glass cloth is brought into a semi-hardened state by heating it at a proper temperature for a proper period of time. The prepreg layers are bonded by thermocompression to the metal layer 11 by means of a press or the like, thereby to form the substrate layers 12. Thereafter, the part of the substrate layer 12 corresponding to the area to become the exposed metal part 11A is subjected to so-called "Zaguri Working" [end milling] in which the part is cut away by moving the fore end of a drill 30, whereby the exposed metal part 11A is formed.

In the formation of the exposed metal part 11A by such "Zaguri Working" [end milling], it is difficult in operation to cut away only the part of the substrate layer 12 corresponding to the exposed part 11A. In general, therefore, the underlying metal layer 11 is simultaneously subjected to cutting so as to reliably remove the substrate layer 12.

In the above formation of the exposed metal part 11A by "Zaguri Working" [end milling], the drill 30 be moved over all of the part to be exposed 11A, not over only the peripheral edge thereof. Therefore, long machining times have been required. Further, in order to reliably remove the part of the substrate layer 12 corresponding to the exposed part 11A, some of the metal layer 11 underlying the part must also be cut away. It has accordingly been impossible to form the exposed part 11A without any flaw to the metal layer 11. Moreover, since the whole area of the exposed part 11A and also the metal layer 11 must be cut away by the drill 30 in this manner, it is easy for the drill 30 to do some damage.

In addition, as a machining method of forming a hole in the substrate layer 12 of the circuit board for mounting electronic components 10, there has been proposed a "Method of Manufacturing a Printed-Wiring Circuit Board" employing a laser beam for machining as disclosed in the official gazette of Japanese Patent Application Laid-open No. 61-95792. In view of the claim in the official gazette, the "Method of Manufacturing a Printed-Wiring Circuit Board" is as follows:

"In a method of forming a hole by the use of a laser beam in a part of a printed-wiring circuit board from which a metal foil has been removed; a method of manufacturing a printed-wiring circuit board characterized in that said hole is formed by the laser beam whose lasing wavelength lies in a region of wavelengths to be reflected by said metal foil and which has a light projection area covering, at least, said part with said metal foil removed therefrom."

This method is a very excellent technique for forming small holes. In order to remove the part of the substrate layer 12 having a comparatively large area and to expose the metal layer 11, however, the substrate layer 12 corresponding to the entire exposed part 11A must be vaporized by the laser beam, and this takes a considerable period of time and necessitates prolonged operation of a laser machining apparatus which is expensive, so that this method is unsuitable as a technique for manufacturing the circuit board for mounting electronic components.

The inventors therefore made various studies on ways to easy from the exposed metal part 11A of comparatively large area in the substrate layer 12 of the circuit board for mounting electronic components 10 while the machining of the substrate layer 12 with the laser beam is utilized, to complete, the present invention.

The present invention has been made on the basis of the above circumstances, and a problem to be solved by the invention is the difficulty of the prior-art technique when forming an exposed metal part 11A of comparatively large area.

An object of the present invention is to provide a method according to which, even when the machining of a laser beam is partial, an exposed metal part 11A in an electronic component-mounting circuit board 10 can be formed reliably and in a short time over a comparatively large area, and a circuit board for mounting electronic components 10 of high reliability can be manufactured.

An expedient which the present invention has adopted for solving the aforementioned problems will be summarized below with symbols for use in the description of embodiments.

"A a circuit board for mounting electronic components comprising a substrate layer and a metal layer, a predetermined part of the metal layer being exposed from the substrate layer, wherein the predetermined exposed part is produced by:

(1) arranging a mask 16 between said substrate layer 12 and a part of said metal layer 11 to become the exposed part 11A, and thereafter unitizing said substrate layer 12 with said metal layer 11;

(2) projecting a laser beam onto that part of said substrate layer 12 on said metal layer 11 which surrounds said mask 16, in a direction from a side of said substrate layer 12 to a side of said metal layer 11, thereby to cut away said part of said substrate layer 12 surrounding said mask 16; and (3) stripping off that part of said substrate layer 12 which remains on said mask 16, together with said mask 16."

Figure 4A:
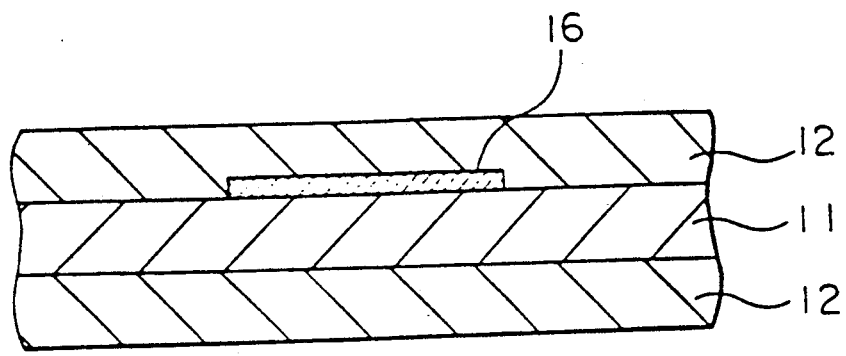

More specifically, in the method of the present invention, as shown in FIG. 4(a), a mask 16 is first arranged between a substrate layer 12 and the part of a metal layer 11 to become an exposed part 11A, in order to keep the substrate layer and the part of the metal layer from being united, but allowing substrate layer 12 and the other part of the metal layer 11 to become unitized.

Any type of mask 16 may be used insofar as it does not deform even when subjected to the shocks of heat, pressure, etc. in the series of steps for manufacturing the circuit board for mounting electronic components 10, such as the step of unitizing the metal layer 11 with the substrate layer 12, and as it can be finally stripped off from the metal layer 11 by any expedient. Mentioned as examples are resin films of comparatively high thermal resistance, and metal foils.

In addition, the metal layer 11 and the substrate layer 12 are unitized in such a way that, while a thermosetting resin before being fully hardened is held in close contact with the metal layer 11, it is heated at a proper temperature for a proper period of time, so as to bond the metal layer 11 and the substrate layer 12. As the unitizing method here, there is mentioned, e.g., a method in which a layer of prepreg 12b is stacked on the metal layer 11, to be bonded by thermocompression with a press or the like, thereby forming the prepreg layer 12b into the substrate layer 12, a method in which an adhesive sheet 12a in a semi-hardened state is arranged between the metal layer 11 and the substrate layer 12, to be bonded by thermocompression with a press or the like, thereby unitizing the substrate layer 12, or a method of so-called "injection molding" in which the thermosetting resin is injected into a metal mold holding the metal layer 11 therein, and it is thermally set into the substrate layers 12.

Figure 4B:
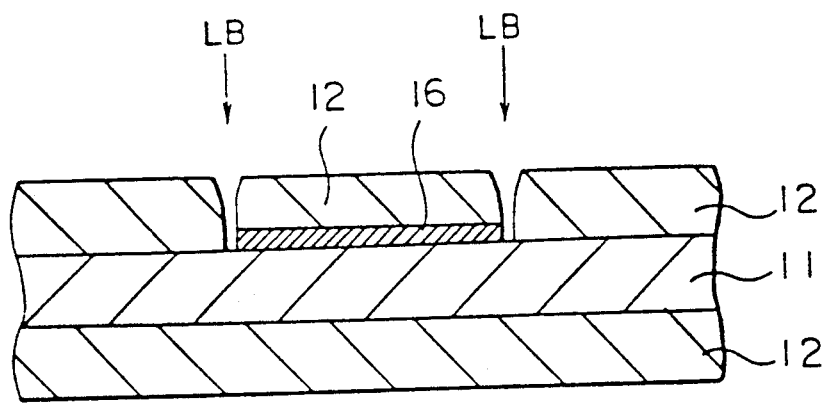

Subsequently, as shown in FIG. 4(b), a laser beam LB is projected from outside the substrate layer 12 as described above, onto that part of the substrate layer 12 on the metal layer 11 which surrounds the mask 16.

The laser beam LB for use here needs to favorably cut the substrate layer 12 without flawing the metal layer 11. Therefore, it should desirably have a wavelength which exhibits high reflectivity for metals. In this regard, if $CO_2$ laser having a lasing wavelength of 10.6 μm is employed, the substrate layer 12 can be cut without inflicting any damage to the metal layer 11.

In this manner, that part of the substrate layer 12 on the metal layer 11 which surrounds the mask 16 is cut by the laser beam, whereby a groove which reliably separates the part of the substrate layer 12 overlying the mask 16 and the other part of the substrate layer 12 is formed around the mask 16 as shown in FIG. 4(b).

When such a groove surrounding the mask 16 has been formed, the part of the substrate layer 12 overlying the mask 16 is completely separated from the other part of the substrate layer 12. Moreover, the mask 16 and the metal layer 11 are not bonded as stated before, so that the mask 16 can be readily stripped off.

Figure 4C:
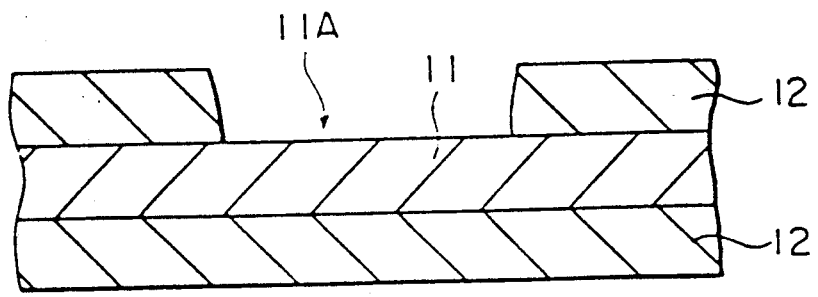

After the above steps, the part of the substrate layer 12 overlying the mask 16 is stripped off from the metal layer 11 together with this mask to complete the exposed metal part 11A as shown in FIG. 4(c).

When the exposed metal part 11A of the electronic component-mounting circuit board 10 is formed by such a method, functions as stated below are attained:

At the part to become the exposed metal part 11A, the unitizing between the substrate layer 12 and the metal layer 11 is hindered by the mask 16. By way of example, even when an adhesive sheet the resin of which exhibits a high flowability during the thermocompression is adopted as the adhesive sheet 12a for bonding the substrate layer 12 and the metal layer 11, it is possible owing to the intervention of the mask 16 to prevent the resin of the adhesive sheet 12a from flowing out onto the surface of the exposed metal part 11A. Therefore, an adhesive sheet 12a that has, such properties as excellent heat, moisture and chemical resistance, can be adopted.

Further, especially when a $CO_2$ laser having a lasing wavelength of 10.6 μm is adopted, a laser beam exhibiting high reflectivity for metals can be obtained, as well as one that favorably cut resin, glass cloth, etc. As a result, if the laser beam is projected from the substrate layer 12 side to the metal layer 11 side, only the substrate layer 12 is selectively cut without damaging the metal layer 11. Accordingly, even in a case where the thickness of the substrate layer 12 fluctuates to some extent, the cutting with the laser beam is stopped at the upper surface of the metal layer 11 without fail, and hence, the depth of the cutting is controlled easily and precisely.

In addition, machining with the laser beam may be performed for that part of the substrate layer 12 on the metal layer 11 which surrounds the mask 16, and no operation at all is required for the part of the substrate layer 12 overlying the mask 16. Therefore, the machining operation is completed in a very short time.

Moreover, since the machining with the laser beam is noncontact machining, the tool damage during the machining operation can be completely ignored, and hence, stable machining can be effected.

Now, the manufacturing method according to the present invention will be described in detail in conjunction with embodiments illustrated in the drawings.

Embodiment 1

Embodiment 1 of the present invention is illustrated in FIG. 5, FIG. 6 and FIG. 7(a), 7(b) and 7(c).

Shown in FIGS. 5 and 6 is a "circuit board for mounting electronic components 10 in which a plurality of outer leads 17a are unitarily formed with internal connection portions 11C inside said outer leads, and said internal connection portions 11C are unitarily provided with a substrate layer 12 on both sides of said internal connection portions, whereby the individual outer leads 17a protrude from beveled side surfaces of said substrate layer 12, and said outer leads 17a and conductor circuit pieces 14 formed on at least one side of the substrate are electrically connected."

The circuit board for mounting electronic components 10 is of the type wherein the electrical connections between an electronic component 20 and the outer leads 17a are effected through the conductor circuit pieces 14 formed on the substrate layer 12. In particular, a metal layer 11 is adopted in which the outer leads 17a and the internal connection portions 11C are unitarily formed. In the circuit board for mounting electronic components 10, accordingly, the substrate layer 12 is unitarily provided on both sides of the internal connection portions 11C constituting the metal layer 11, with the outer leads 17a protruding outwards from the beveled side surfaces of the substrate layer 12. Herein, the circuit board for mounting electronic components 10 is characterized in that the conductor circuit pieces 14 on the substrate layer 12 and the outer leads 17a are electrically connected by through holes 15 which are provided so as to penetrate the internal connection portions 11C.

A method of manufacturing the circuit board for mounting electronic components 10 will be described below with reference to FIGS. 7(a)-7(c).

(1) A lead frame 17 (which corresponds to the metal layer 11) is formed by etching a lead frame material, and masks 16 are arranged so as to cover both surfaces of each part of the lead frame 17 to become an outer lead 17a. Further, a prepreg layer and a copper foil are stacked outside each of the masks 16 in the order mentioned, and the stacked constituents are subjected to thermocompression by a press, thereby to be brought into a unitary lamination. Thus, there is formed a circuit board in a shape in which, as shown in FIG. 7(a), the lead frame 17 is buried in the substrate layer 12 in such a manner that the parts to become the outer leads 17a are kept the masks 16 from being unitarily laminated with the substrate layer 12.

In an example of Embodiment 1, the lead frame material used was a copper alloy sheet which was 0.25 mm thick, and the prepreg used was a so-called "glass triazine prepreg" in which glass cloth was impregnated with a bismaleimide triazine resin that was then brought into a semi-hardened state.

In addition, the mask 16 used was a polyphenylene sulfide film, namely, a so-called "PPS" film which was 50 μm thick.

(2) Subsequently, the through holes 15 for electrically connecting the outer leads 17a with the conductor circuit pieces 14 to be formed on the top surface of the substrate layer 12 were opened by a drill, and the inner walls thereof plated with copper.

Thereafter, the conductor circuit pieces 14 were formed on the top surface of the substrate layer 12 by etching the copper foils to form a circuit board as shown in FIG. 7(b).

(3) Subsequently, those parts of the substrate layer 12 on the metal layer 11 which surround the masks 16 are cut using a $CO_2$ laser, whereby grooves with beveled surfaces which reliably separate the parts of the substrate layer 12 overlying the masks 16 from the other part of the substrate layer 12 are formed around the respective masks 16. Then, since the respective masks 16 and the corresponding outer leads 17a are not bonded, the mask and the parts of the substrate layer 12 overlying the outer leads 17a fall into the state in which they are perfectly separated from the other parts.

When similar laser machining is also performed from the bottom surface of the substrate layer 12, a circuit board as shown in FIG. 7(c) is formed.

(4) Lastly, the masks 16 and the parts of the substrate layer 12 overlying and underlying the outer leads 17a are stripped off. Then, the circuit board for mounting electronic components 10 as shown in FIG. 6 is formed.

In the circuit board for mounting electronic components 10 manufactured by such a method, the outer leads 17a are not damaged by the beam of the laser, and hence, physical performances of the outer leads 17a, such as bending strength and pulling-out strength, are not degraded.

EMBODIMENT 2

Next, Embodiment 2 of the present invention will be described in accordance with FIG. 8 and FIGS. 9(a)-(c).

A circuit board for mounting electronic components shown in FIG. 8 has a recess 13 for mounting an electronic component 20 therein, the recess 13 having beveled side surfaces substantially transverse to the metal part 11A and heat radiating portions 18 for dissipating heat produced from the electronic component 20, into the atmosphere. A method of manufacturing the circuit board for mounting electronic components 10 will be described below with reference to FIGS. 9(a)-9(c).

(1) A mask 16 is arranged on a portion of an 1.0 mm thick aluminum plate 11B which is to become a exposed metal part 11A. An adhesive sheet 12a and a substrate layer 12 are stacked on each of the outer sides of the resultant aluminum plate 11B, and the stacked constituents are subjected to thermocompression by a press, thereby to bring the aluminum plate 11B and the substrate layers 12 into a unitized lamination. Then, a circuit board as shown in FIG. 9(a) is formed.

In an example of Embodiment 2, the mask 16 used was a 25 μm thick aluminum foil, and the adhesive sheet 12a used was a semi-hardened film which contained an epoxy resin as its principal component. In addition, the substrate layer 12 used was a glass epoxy prepreg which was fully hardened.

(2) Subsequently, that part of the substrate layer 12 overlying the metal layer 11 (aluminum plate 11B) which surrounds the mask 16 is cut using a $CO_2$ laser to form a circuit board as shown in FIG. 9(b) whereby the beveled inner side surfaces of the recess 13 shown in FIG. 8 are formed.

(3) Lastly, the mask 16 and the part of the substrate layer 12 overlying the exposed metal part 11A are stripped off to form, the electronic component-mounting recess 13 or the heat radiating portion 18 in which the metal layer 11 is exposed as shown in FIG. 9(c).

The heat radiating portions 18 can, of course, be formed on both the surfaces of the circuit board for mounting electronic components 10, a higher degree of heat radiation being attainable in that case.

As described above in detail, the present invention consists, as exemplified by the foregoing embodiments, in:

A circuit board for mounting electronic components comprising a substrate layer and a metal layer, a predetermined part of the metal layer being exposed from the substrate layer, wherein the predetermined exposed part is produced by:

(1) arranging a mask 16 between said substrate layer 12 and a part of said metal layer 11 to become the exposed part 11A, and thereafter unitizing said substrate layer 12 with said metal layer 11;

(2) projecting a laser beam onto that part of said substrate layer 12 on said metal layer 11 which surrounds said mask 16, in a direction from a side of said substrate layer 12 to a side of said metal layer 11, thereby to cut away said part of said substrate layer 12 surrounding said mask 16; and (3) stripping off that part of said substrate layer 12 which remains on said mask 16, together with said mask 16.

Thus, even when there is only partial cutting with the laser beam, the formation of the exposed metal part 11A in the circuit board for mounting electronic components 10 can be carried out reliably and in a short time over a comparatively large area without damaging the metal layer 11.

More concretely, according to the present invention, besides the fact that the exposed metal part 11A constituting the circuit board for mounting electronic components 10 can be formed reliably and in a short time, tool damage during the machining operation can be completely ignored due to the noncontact machining of the laser beam.

In addition, the mask 16 is arranged on the part to become the exposed metal part 11A, so that when the metal layer 11 and the substrate layer 12 are to be unitized, the resin does not adhere to the surface of the part to become the exposed metal part 11A. It is therefore possible to adopt, for example, an adhesive sheet whose flowability during thermocompression is comparatively high. Accordingly, an adhesive sheet having superior performance, such as in heat, chemical and moisture resistance, can be employed, with the result that a circuit board for mounting electronic components 10 of high reliability can be obtained.

Further, as a laser beam has much better capabilities in cutting resins than metals, the metal layer 11 is not damaged even when the substrate layer 12 has been fully cut. Therefore, the depth of the cutting can be reliably controlled, and the physical strengths of the metal layer 11 are not degraded.

What is claimed is:

1. A circuit board for mounting electronic components comprising:

an electrically insulating substrate having opposed first and second surfaces and third and fourth beveled side surfaces substantially transverse to the first and second surfaces;

a central mounting pad disposed on the first surface of said substrate for mounting an electronic component;

a plurality of electrically conducting leads disposed on the first surface, each lead including a first end proximate the mounting pad and a second end;

a plurality of through holes penetrating the substrate from the first to the second surface, the substrate surfaces defining the through holes being plated with an electrically conducting material, the second end of each of said leads being electrically connected to the plated surface of a respective through hole; and a plurality of electrical leads embedded in the substrate and extending outwardly from the third and fourth beveled side surfaces, each lead intersecting and being electrically connected to the plated surface of a respective through hole.

2. The circuit board of claim 1 wherein said beveled side surfaces are formed by laser machining.

3. A circuit board for mounting electronic components comprising:

a laminated substrate including first and second electrically insulating layers sandwiching a central layer, part of said central layer being electrically conducting and part of said central layer being electrically insulating, the first electrically insulating layer having beveled inner side surfaces defining a central opening in the first electrically insulating layer exposing an electrically conducting part of the central layer for mounting an electronic component;

a plurality of electrically conducting leads disposed on the first layer, each lead including a first end proximate the central opening and a second end;

a plurality of through holes penetrating the first and second layers and an electrically insulating part of the central layer, the substrate surfaces defining the through holes being plated with an electrically conducting material, the second end of each of said leads being electrically connected to the plated surface of a respective through hole; and a plurality of electrical leads embedded in the electrically insulating part of the central layer, each lead intersecting and being electrically connected to the plated surface of a respective through hole.

4. The circuit board of claim 3 wherein said beveled side surfaces are formed by laser machining.

* * * * *